(12) United States Patent
Bolton

(10) Patent No.: US 8,355,112 B2
(45) Date of Patent: Jan. 15, 2013

(54) METHODS AND SYSTEMS FOR STRENGTHENING LCD MODULES

(75) Inventor: Brian Bolton, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/460,610

(22) Filed: Apr. 30, 2012

(65) Prior Publication Data

US 2012/0234049 A1  Sep. 20, 2012

Related U.S. Application Data

(62) Division of application No. 12/193,001, filed on Aug. 16, 2008, now Pat. No. 8,169,587.

(60) Provisional application No. 60/956,312, filed on Aug. 16, 2007.

(51) Int. Cl.
*G02F 1/13* (2006.01)

(52) U.S. Cl. .......................... 349/187; 349/158

(58) Field of Classification Search .................. None
See application file for complete search history.

(56) References Cited

U.S. PATENT DOCUMENTS

| | | | |
|---|---|---|---|
| 3,843,472 A | 10/1974 | Toussaint et al. | |
| 4,015,045 A | 3/1977 | Rinehart | |
| 4,178,082 A | 12/1979 | Ganswein et al. | |
| 4,849,002 A | 7/1989 | Rapp | |
| 4,872,896 A | 10/1989 | LaCourse et al. | |
| 5,369,267 A | 11/1994 | Johnson et al. | |
| 5,733,622 A | 3/1998 | Starcke et al. | |
| 5,953,094 A | 9/1999 | Matsuoka et al. | |
| 6,621,542 B1 | 9/2003 | Aruga | |
| 6,810,688 B1 | 11/2004 | Guisit et al. | |
| 7,609,358 B2 * | 10/2009 | Yamazaki et al. | 349/190 |
| 7,810,355 B2 | 10/2010 | Feinstein et al. | |
| 8,169,587 B2 | 5/2012 | Bolton | |
| 2006/0238695 A1 | 10/2006 | Miyamoto | |
| 2007/0013822 A1 | 1/2007 | Kawata et al. | |
| 2007/0030436 A1 | 2/2007 | Sasabayashi | |
| 2008/0243321 A1 | 10/2008 | Walser et al. | |
| 2009/0067141 A1 | 3/2009 | Dabov et al. | |
| 2009/0153729 A1 | 6/2009 | Hiltunen et al. | |
| 2009/0197048 A1 | 8/2009 | Amin et al. | |
| 2009/0202808 A1 | 8/2009 | Glaesemann et al. | |
| 2009/0257189 A1 | 10/2009 | Wang et al. | |

(Continued)

FOREIGN PATENT DOCUMENTS

EP  2036867 A1  3/2009

(Continued)

OTHER PUBLICATIONS

Restriction Requirement for U.S. Appl. No. 12/193,001, dated Mar. 15, 2010.

(Continued)

*Primary Examiner* — Richard Kim
(74) *Attorney, Agent, or Firm* — Dorsey & Whitney LLP

(57) ABSTRACT

Systems and methods for improving strength of thin displays, such as Liquid Crystal Display (LCD) displays, are disclosed. In one embodiment, a display can use an asymmetrical arrangement of layers (e.g., glass layers) where one layer is thicker than another layer. Different scribing techniques can also be used in singulating the different layers. The asymmetrical arrangement and/or scribing techniques can facilitate displays that are not only thin but also adequately strong to limit susceptibility to damage.

22 Claims, 6 Drawing Sheets

U.S. PATENT DOCUMENTS

| | | |
|---|---|---|
| 2009/0324899 A1 | 12/2009 | Feinstein et al. |
| 2010/0009154 A1 | 1/2010 | Allan et al. |
| 2010/0296027 A1 | 11/2010 | Matsuhira et al. |
| 2011/0003619 A1 | 1/2011 | Fujii |
| 2011/0019123 A1 | 1/2011 | Prest et al. |
| 2011/0019354 A1 | 1/2011 | Prest et al. |
| 2011/0067447 A1 | 3/2011 | Zadesky et al. |
| 2011/0072856 A1 | 3/2011 | Davidson et al. |
| 2011/0102346 A1 | 5/2011 | Orsley et al. |
| 2011/0159321 A1 | 6/2011 | Eda et al. |

FOREIGN PATENT DOCUMENTS

| | | |
|---|---|---|
| EP | 2075237 | 7/2009 |
| JP | 6242260 A | 9/1994 |
| WO | WO 00/47529 A | 8/2000 |
| WO | WO 02/42838 A1 | 5/2002 |
| WO | WO 2004/106253 A | 12/2004 |
| WO | WO 2008/143999 A1 | 11/2008 |
| WO | WO 2010/005578 | 1/2010 |
| WO | WO 2010/014163 | 2/2010 |

OTHER PUBLICATIONS

Office Action for U.S. Appl. No. 12/193,001, dated Apr. 29, 2010.
Office Action for U.S. Appl. No. 12/193,001, dated Oct. 13, 2010.
Advisory Action for U.S. Appl. No. 12/193,001, dated Dec. 29, 2010.
Office Action for U.S. Appl. No. 12/193,001, dated May 19, 2011.
Notice of Allowance for U.S. Appl. No. 12/193,001, dated Jan. 13, 2012.

* cited by examiner

METHODS AND SYSTEMS FOR STRENGTHENING LCD MODULES

CROSS REFERENCE TO RELATED APPLICATIONS

This application is a divisional application of U.S. patent application Ser. No. 12/193,001, filed Aug. 16, 2008 now U.S. Pat. No. 8,169,587, entitled "METHODS AND SYSTEMS FOR STRENGTHENING LCD MODULES", which is herein incorporated by reference, and which in turn claims priority to U.S. Provisional Patent Application No. 60/956,312, filed Aug. 16, 2007, entitled "METHODS AND SYSTEMS FOR STRENGTHENING LCD MODULES", which is herein incorporated by reference.

BACKGROUND OF THE INVENTION

Conventionally, small form factor devices, such as handheld electronic devices, have a display arrangement that includes various layers. The various layers include at least a display technology layer, and may additionally include a sensing arrangement and/or a cover window disposed over the display technology layer. In some cases, the layers may be stacked and adjacent one another, and may even be laminated thereby forming a single unit. In other cases, at least some of the layers are spatially separated and not directly adjacent. For example, the cover window and/or sensing arrangement may be disposed above the display such that there is a gap therebetween. By way of example, the display technology layer may include or pertain to a Liquid Crystal Display (LCD) that includes a Liquid Crystal Module (LCM). The LCM generally includes an upper glass sheet and a lower glass sheet that sandwich a liquid crystal layer therebetween. The sensing arrangement may be a touch sensing arrangement such as those used to create a touch screen. For example, a capacitive sensing touch screen can include substantially transparent sensing points or nodes dispersed about a sheet of glass (or plastic). In addition, the cover window, which is typically designed as the outer protective barrier, may be glass or plastic. However, glass tends to provide a better protective barrier given its strength and scratch resistance.

Typically, the LCM is the weakest portion of the display region in terms of strength against bending and damage if dropped. The other layers may be formed with stronger glass materials and/or may be thicker, thereby increasing their strength. Because the LCM is the weakest portion, the LCM is often the part of the display region most susceptible to damage when the small form factor device is stressed as for example in a drop event. Here, one or both sheets of glass may crack or break as a result of the drop event. This problem is exacerbated by the trend to make handheld electronic devices thinner.

Thus, there is a need for improved approaches to make displays that are not only thin but also sufficiently strong to avoid unnecessary damage.

SUMMARY OF THE INVENTION

The invention is related to systems and methods for improving strength of thin displays, such as Liquid Crystal Display (LCD) displays. In one embodiment, a display can use an asymmetrical arrangement of layers (e.g., glass layers) where one layer is thicker than another layer. Different scribing techniques can also be used in singulating the different layers. The asymmetrical arrangement and/or scribing techniques can facilitate displays that are not only thin but also adequately strong to limit susceptibility to damage.

The systems and methods are especially suitable for displays (e.g., LCD displays) assembled in small form factor electronic devices such as handheld electronic devices (e.g., cell phones, media players, PDAs, remote controls, etc.). The systems and methods can be used for displays for portable electronic devices (e.g., portable computers, tablet computers, displays, monitors, televisions, etc.).

The invention can be implemented in numerous ways, including as a method, system, device, or apparatus. Several embodiments of the invention are discussed below.

As a display for an electronic device, where the display has an asymmetric glass configuration, one embodiment of the invention includes at least: a first glass sheet having a first thickness and having a first edge character; and a second glass sheet proximate but spaced apart from the first glass sheet, the second glass sheet having a second thickness, where the second thickness is different than the first thickness. The second glass sheet having a second edge character, and the second edge character being different than the first edge character.

As a method of forming a display with an asymmetric glass configuration, one embodiment of the invention includes at least: providing a first glass sheet having a first thickness; providing a second glass sheet having a second thickness; cutting the first glass sheet with a first cutting process, the first cutting process forming a first edge on the first glass sheet; cutting the second glass sheet with a second cutting process that is different than first cutting process, the second cutting process forming a second edge on the second glass sheet; and positioning the first and second sheets relative to one another in order to form the display.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

Figure 1A:
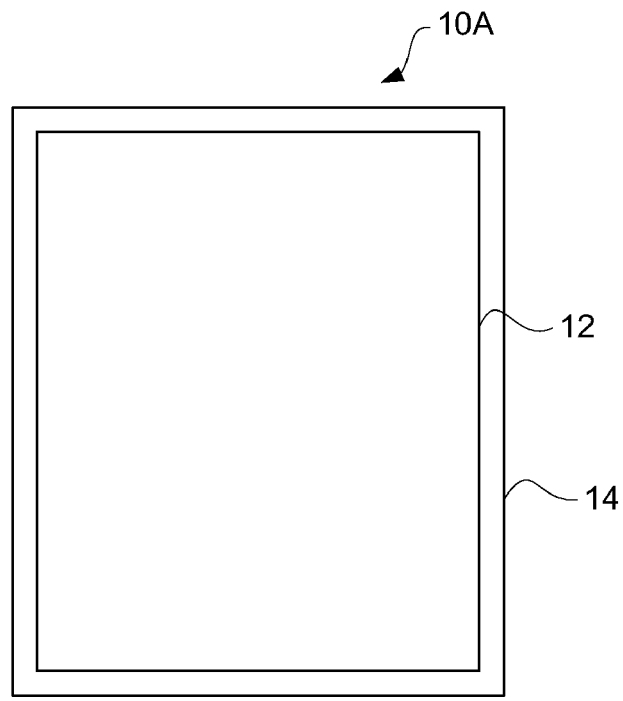
FIG. 1A is simplified diagram of an electronic device, in accordance with one embodiment of the present invention.

The invention is related to systems and methods for improving strength of thin displays, such as Liquid Crystal Display (LCD) displays. In one embodiment, a display can use an asymmetrical arrangement of layers (e.g., glass layers) where one layer is thicker than another layer. Different scribing techniques can also be used in singulating the different layers. The asymmetrical arrangement and/or scribing techniques can facilitate displays that are not only thin but also adequately strong to limit susceptibility to damage.

The systems and methods are especially suitable for displays (e.g., LCD displays) assembled in small form factor electronic devices such as handheld electronic devices (e.g., cell phones, media players, PDAs, remote controls, etc.). The systems and methods can be used for displays for portable electronic devices (e.g., portable computers, tablet computers, monitors, displays, televisions, etc.).

Small form factor devices such as handheld electronic devices typically include a display region that includes various layers. The various layers may include at least a display, and may additionally include a sensing arrangement and/or a cover window disposed over the display. In some cases, the layers may be stacked and adjacent one another, and may even be laminated thereby forming a single unit. In other cases, at least some of the layers are spatially separated and not directly adjacent. For example, the cover window and/or sensing arrangement may be disposed above the display such that there is a gap therebetween. By way of example, the display may include a Liquid Crystal Display (LCD) that includes a Liquid Crystal Module (LCM). The LCM generally includes at least an upper glass sheet and a lower glass sheet that sandwich a liquid crystal layer therebetween. The sensing arrangement may be a touch sensing arrangement such as those used to create a touch screen. For example, a capacitive sensing touch screens can include substantially transparent sensing points or nodes dispersed about a sheet of glass (or plastic). In addition, the cover window, which is typically designed as the outer protective barrier, may be glass or plastic. However, glass tends to provide a better protective barrier given its strength and scratch resistance.

Often, the LCM is the weak link in the display region in terms of strength against bending and damage if dropped. The other layers may be formed with stronger glass materials and further they may be thicker thereby increasing their strength. Because it is the weakest portion, the LCM is often the part of the display region most susceptible to damage when the small form factor device is stressed as for example in a drop event. By way of example, one or both sheets of glass may crack or break. This problem is exacerbated with ever thinning electronic devices, i.e., there is a continuing need to make things smaller and therefore thinner (and thinner typically lends itself to less strength). Conventionally, a LCM includes a symmetric glass configuration where the upper and lower glass sheets have the same thickness of about 0.4 mm or greater. Recently, there has been a push to move the symmetrical thickness to glass layers of about 0.3 mm (although only a few cases have been implemented), and it is generally believed that the industry at some point may move to a symmetrical thickness to glass layers of about 0.225 mm.

Asymmetrical glass sheet thickness has been proposed as one means of improving strength of LCMs. This works by having LCM depend on the thicker of the two sheets for most of its strength. For the same overall stack height, an assembly having one sheet at 0.35 and the other sheet at 0.25 mm has an overall higher bending strength than an assembly of two sheets at 0.3 mm each. This is because the bending strength goes as the square of the thickness, meaning that small increase in thickness can have a relatively large effect on strength.

Utilizing laser scribing in favor of conventional mechanical wheel scribing has also been proposed as one means of improving strength of LCMs. Laser scribing may provide a 2× to 3× strength improvement over other methods of glass cutting especially mechanical methods such as wheel scribing.

Unfortunately, laser scribing has its limitations. Laser scribing is not capable of cutting glass sheets of very small thickness. A sufficiently large thickness is typically needed to prevent the generated thermal gradient from penetrating all the way through to the opposite side of the glass, thereby diminishing the thermally generated tensile stress needed to separate the glass. By way of example, problems may arise when trying to apply laser scribing to glass thicknesses less than 0.25 mm and even more particularly less than 0.225 mm in that the thermal gradient necessary for successful scribing is difficult to properly generate and control in such thin glass sheets. This means that the current state of the art may not allow for two sheets of less than 0.25 mm to be laser scribed with sufficiently high yields. Therefore, it is generally believed that as the industry pushes towards thinner sheets, laser scribing will become increasingly challenging unless new technologies are developed to overcome its deficiencies.

The present invention overcomes the current limitations of laser scribing by utilizing an asymmetrical glass configuration and laser scribing the thicker glass sheet where the thicker glass sheet is formed to a dimension capable of being laser scribed. That is, the thicker glass sheet is configured to be as thick as necessary to perform laser scribing thereon (able to form desired thermal gradients). In one embodiment, the thickness is greater than 0.225 mm, more particularly greater than 0.25 mm, even more particularly greater than 0.275 mm and yet more particularly greater than 0.3 mm. Not only does the thicker glass sheet provide most of its structural rigidity to the assembly due to its thickness but now also to its stronger laser scribed edges (a 2× to 3× strength improvement of laser scribing can be obtained on the edge that matters). Since the thinner glass sheet provides little strength to the assembly anyway, and because it may be too thin for laser scribing, it can be cut with normal wheel scribing providing reasonably high yield rates for both sides.

In order to maintain the same dimensional envelope as the industry, in one example, for what would typically be a 0.225/0.225 mm envelope, the LCM according to one embodiment of the invention can be configured with about a 0.275 mm glass sheet having laser scribed edges and a 0.175 mm glass sheet having edges scribed with something other than laser scribing (e.g., mechanical wheel scribing). Of course, other dimensions and other envelopes can be used. For example, according to another embodiment, the LCM can be configured with about a 0.25 mm glass sheet having laser scribed edges and a 0.15 mm glass sheet having edges scribed with something other than laser scribing.

These and other embodiments of the invention are discussed below with reference to FIGS. 1-8B. However, those skilled in the art will readily appreciate that the detailed description given herein with respect to these figures is for explanatory purposes as the invention extends beyond these limited embodiments.

Figure 1B:
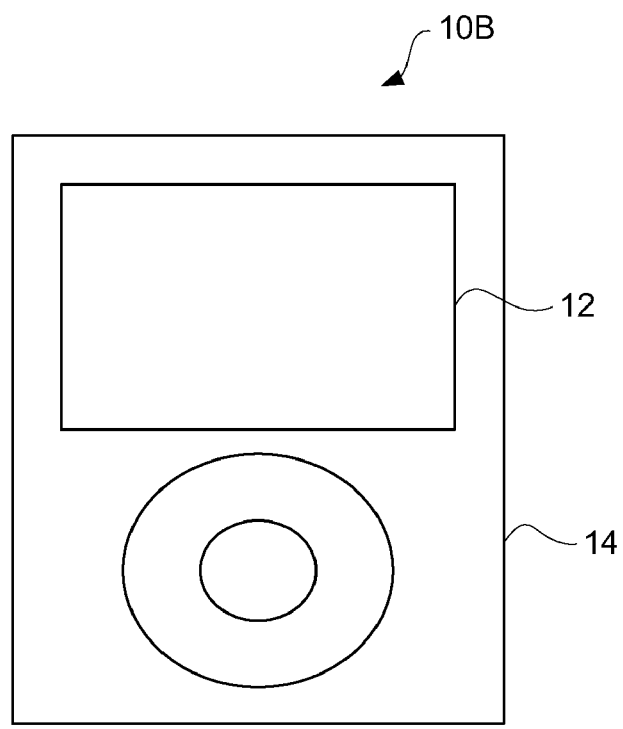
FIG. 1B is simplified diagram of an electronic device, in accordance with one embodiment of the present invention.

FIGS. 1A and 1B are simplified diagrams of an electronic device 10A and 10B, in accordance with one embodiment of the present invention. The electronic devices 10A and 10B may for example be embodied as portable or handheld electronic devices having a thin form factor. The electronic devices 10A and 10B may for example correspond to media players, media storage devices, PDAs, tablet PCs, computers, cellular phones, smart phones, GPS units, remote controls, and the like. By way of example, the electronic device may correspond to an iPhone™ or iPod™ manufactured by Apple Inc. of Cupertino, Calif.

Both electronic devices 10A and 10B include a display area 12 that is disposed within a housing 14 of the electronic devices 10A and 10B. The electronic device 10A of FIG. 1A includes a full view or substantially full view display area 12 that consumes a majority if not all of the front surface of the electronic device 10A. The electronic device 10B of FIG. 1B includes a partial display area 12 that only takes up a portion of the front surface of the electronic device 10B. The display area 12 may be embodied in a variety of ways. In one example, the display area 12 consists of at least a display such as a flat panel display and more particularly an LCD display. The display area 12 may additionally include a cover window that is positioned over a display. The cover window may be formed from glass. As should be appreciated glass resists scratching and therefore typically provides a better surface than plastic especially for portable electronic devices that are placed in bags, cases, backpacks, pockets, and the like. The display area 12 may alternatively or additionally include a touch sensing device positioned over the display. For example, the display area 12 may include one or more glass layers having capacitive sensing points distributed thereon. Each of these components can be separate layers or they may be integrated into one or more stacks. In some cases, the cover window acts as the outer most layer of the display area and the display acts as the inner most layer of the display area.

Figure 2:
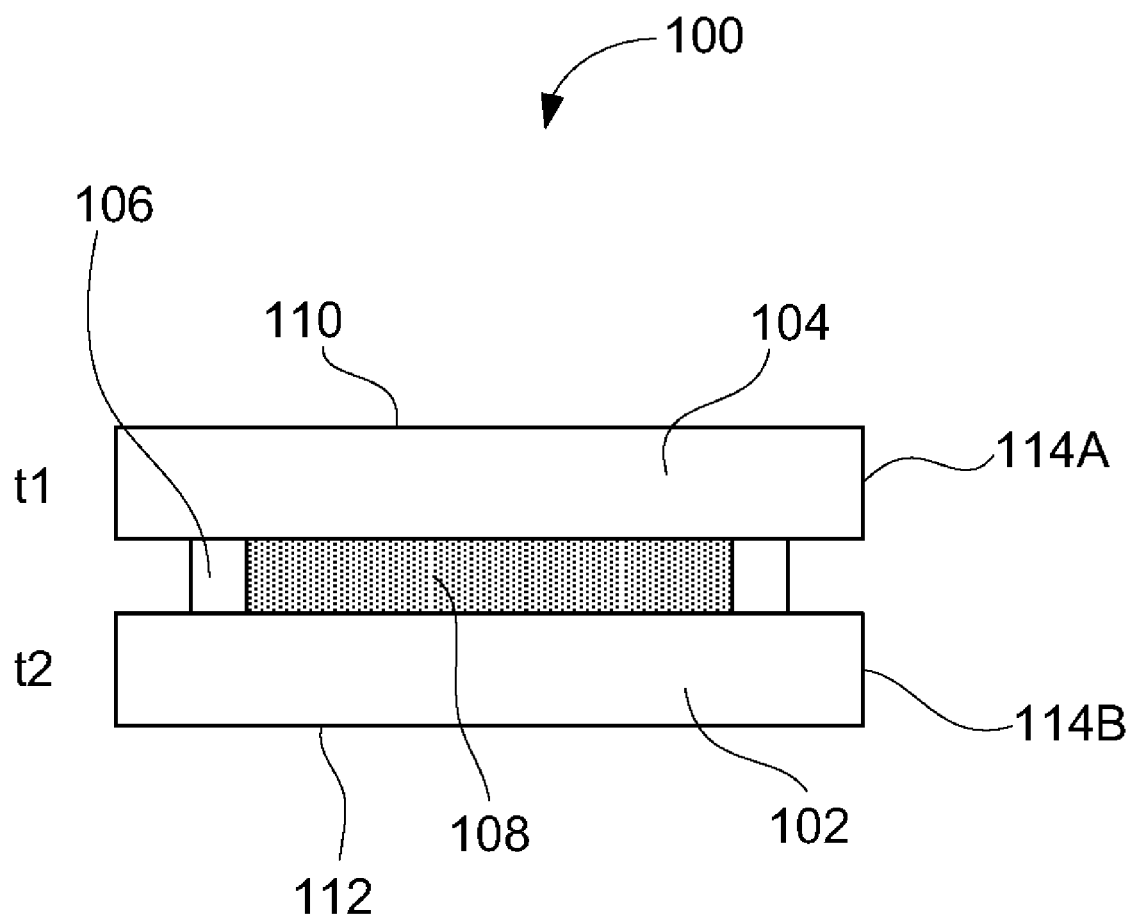
FIG. 2 is a diagram of a Liquid Crystal Module (LCM), in accordance with one embodiment of the present invention.

FIG. 2 is a diagram of an LCM 100, in accordance with one embodiment of the present invention. The LCM 100 may for example be included in the display region described in FIGS. 1A and 1B.

The LCM 100 includes a lower glass sheet 102 and an upper glass sheet 104 that are attached together via a perimeter seal 106. This arrangement is configured to encapsulate a liquid crystal layer 108 internally therein. In most cases, the upper glass sheet 104 includes a color filter 110 and the lower glass sheet includes drive electronics 112 such as Thin Film Transistor (TFT) in order to create colored pixels of a display. Although not shown, a polarizer may be additionally placed over the upper glass sheet 104 and a diffuser for illumination may be placed behind the lower glass sheet 102.

In accordance with one embodiment of the present invention, the LCM 100 includes an asymmetric glass configuration such that the upper and lower glass sheets 102 and 104 have different thicknesses t1 and t2. That is, one is configured to be thicker while the other is configured to be thinner. Put another way, one glass sheet has a thickness greater than the thickness of the other glass sheet, or one glass sheet has a thickness less than the thickness of the other glass sheet. In one embodiment, the upper glass sheet 104 is configured with a larger thickness than the lower glass sheet 102. In another embodiment, the lower glass sheet 102 is configured with a larger thickness than the upper glass sheet 104.

Furthermore, the thicker glass sheet includes a first edge 114A, and the thinner glass sheet includes a second edge 114B that is different than the first edge 114A. The first edge 114A may for example have a fine cut edge and the second edge 114B may have a coarse cut edge. The first edge 114A may be configured with less stress concentrations or substantially no microcracks than the second edge 114B thereby increasing the strength of the thicker glass sheet. The first edge 114A may be configured to be sharper than the second edge 114B thereby increasing the strength of the thicker glass sheet.

The first edge 114A may be formed via a first process and the second edge 114B may be formed via a second process that is different than the first process. The first process may for example be a process that limits stress concentrations and produces a clean sharp edge (e.g., flat and of regular geometric form, uniform and without defects, with "water clear" surface quality). Since this typically cannot be accomplished with mechanical processes, the first process may be a process other than a mechanical process (e.g., wheel scribing). In one embodiment, the first edge 114A is created via a laser scribing process. In fact, the thickness of the thicker layer that includes the first edge 114A may be specifically configured for a laser scribing process. For example, the thickness may be configured as at least the lowest possible thickness capable of being laser scribed. In one embodiment, the second edge 114B is created via a mechanical wheel scribing process capable of cutting glass of almost any thickness. In fact, the thickness of the thinner layer including the second edge 114B may be configured less than the lowest possible thickness capable of being laser scribed.

The materials used to form the glass sheets may be widely varied. In most cases, the glass sheets are formed from the same glass material. However in some cases, additional strength benefits may be realized when using different materials. For example, the thicker glass sheet may be formed from a stronger glass material than the thinner glass sheet (or vice versa). The material typically needs to be selected based on the ability to properly encapsulate the liquid crystal layer. The materials typically need to be sodium free for this reason. The glass may be mineral glass. Examples of glass materials include alimino silicate (e.g., DVTS from Corning), sodalime, borosilicate, and the like. In one particular implementation, the glass sheets are formed from the same material, and further using borosilicate. Borosilicate is typical and may be preferred for TFT LCDs. Further, older STN type LCD displays can use sodalime, but typically not the newer TFT type, due to corrosion that may be caused by the sodium in the sodalime glass.

The materials may be chemically strengthened (both or one). However, it should be noted that glass for TFT LCD displays is typically not chemically strengthened for several reasons: (1) flatness problems induced by chemical strengthening resulting in optical issues, and (2) need for sodium in the glass for chemical strengthening, which will corrode conductive traces unless the glass is passivated by an extra layer of material between the conductive film(s) and the glass.

The sizes of the glass sheets may be widely varied. In one embodiment, the combined thickness of the upper and lower sheets in the asymmetrical glass configuration are configured to equal the combined thickness of the typical symmetrical glass configuration. For example, if the standard symmetrical glass configuration is typically 0.3 mm/0.3 mm, then the asymmetrical glass configuration's total thickness is about 0.6 mm and if the symmetrical glass configuration is typically 0.225/0.225 mm then the asymmetrical glass configuration is about 0.45 mm (these total thicknesses include the glass sheets, they do not include the liquid crystal layer between the two sheets of glass nor other layers above and below the glass sheets in the final assembly). In one embodiment, in cases such as these, the amount of thickness added to the thicker sheet of glass is typically subtracted from the thinner sheet of glass (e.g., increased and decreased the same amount-follow 1:1 ratio). By way of example, the % change of increase/ decrease for each sheet may be between about 25%-1%, more particularly between about 25% to about 10%, even more particularly 25% to about 20%, and even more particularly 23% to about 22%. For example, an increase and decrease of 0.05 mm to a symmetrical configuration of 0.225/0.225 can create an asymmetrical configuration 0.275/0.175 which is about a 22.2% change from the symmetrical dimensions.

Several examples of asymmetrical glass configuration using a 1:1 ratio and a 0.45 mm combined thickness are as follows: 0.3/0.15 mm, 0.295/0.155 mm, 0.29/0.16 mm, 0.285/0.165 mm, 0.28/0.17 mm, 0.275/0.175 mm, 0.27/0.18 mm, 0.265/0.185 mm, 0.26/0.19 mm, 0.255/0.195 mm, or 0.25/0.20 mm. These have been rounded to nearest $10^{th}$, $100^{th}$ or $1000^{th}$, and therefore may vary slightly in actual production. Of course, these configurations are exemplary and not necessary limitations. For example, other envelopes besides a 0.45 combined thickness may be used. The same, similar or different increments may be applied.

In another embodiment, the combined thickness of the upper and lower sheets in their asymmetrical glass configuration do not follow the same overall thickness of a standard symmetrical glass configuration. In cases such as these, the asymmetrical glass configuration is not bound to the same increases and decreases. That is, various ratios of increased thickness and decreased thickness can be used. The ratio of increase to decrease does not need to be 1:1. By way of example, the ratio may be configured to decrease the thickness of the thinner side more than the increase to the thickness of the thicker side or vice versa depending on the needs of the system. In some cases, only one side is changed. For example, an increase to the thicker side with no change to other side (or vice versa).

In one particular embodiment, for a symmetric configuration of about 0.225/0.225 mm or a combined thickness of about 0.45, an asymmetrical glass configuration of about 0.275/0.175 mm (an increase and decrease in thickness of about 0.05 mm) can be used. Of course, other embodiments are not limited to such a combined thickness or such amounts of increase/decrease in thickness of the two sheets. For example, the thickness of the thicker sheet may be increased/decreased as much as 40% of its centerline value (0.225/0.225) to as little as 1% of its centerline value.

One potential problem with decreasing size of thinner sheet is that the thinner sheet loses rigidity and becomes more flexible. As a result, it becomes increasing difficult to maintain a consistent gap between upper and lower glass sheets (which can result in adverse optical effects). Therefore, in one embodiment, high density spacer elements may be placed between the glass sheets to keep the gap consistent. By way of example, spacer elements may be provided every 6-10 pixels. For example 2 rows, 5 pixels wide. The spacers can be placed across entire surface at the 4 corners of the desired matrix. Although rare, conventional spacers may be placed at about every 50-80 pixels.

As noted above, the electronic device can be a handheld electronic device or a portable electronic device. The invention services to enable a display to be not only thin but also adequately strong. Since handheld electronic devices and portable electronic devices are mobile, they are potentially subjected to various different impact events and stresses that stationary devices are not subjected to. As such, the invention is well suited for implementation of displays for handheld electronic device or a portable electronic device that are designed to be thin.

In one embodiment, the size of the display depends on the size of the associated electronic device. For example, with handheld electronic devices, the display (screen) is often not more than five (5) inches diagonal. As another example, for portable electronic devices, such as smaller portable computers or tablet computers, the display (screen) is often between four (4) to twelve (12) inches diagonal. As still another example, for portable electronic devices, such as full size portable computers, displays or monitors, the display (screen) is often between ten (10) to twenty (20) inches diagonal or even larger. However, it should be appreciated that with larger the screen sizes, the thickness of the glass layers may need to be greater. The thickness of the glass layers may need to be increased to maintain planarity of the larger glass layers. While the displays can still remain relatively thin, the minimum thickness can increase with increasing screen size. For example, the minimum combined thickness of the layers (sheets) t1 and t2 shown in FIG. 2 can correspond to about 0.4 mm for small handheld electronic devices, about 0.6 mm for smaller portable computers or tablet computers, about 1.0 mm or more for full size portable computers, displays or monitors, again depending on the size of the screen.

Although not shown in FIG. 2, other layers may be disposed over the LCM. The layers may for example include laminated layers or spatially separated layers. The layers may for example be selected from sensing layers, and cover windows, and the like.

Figure 3:
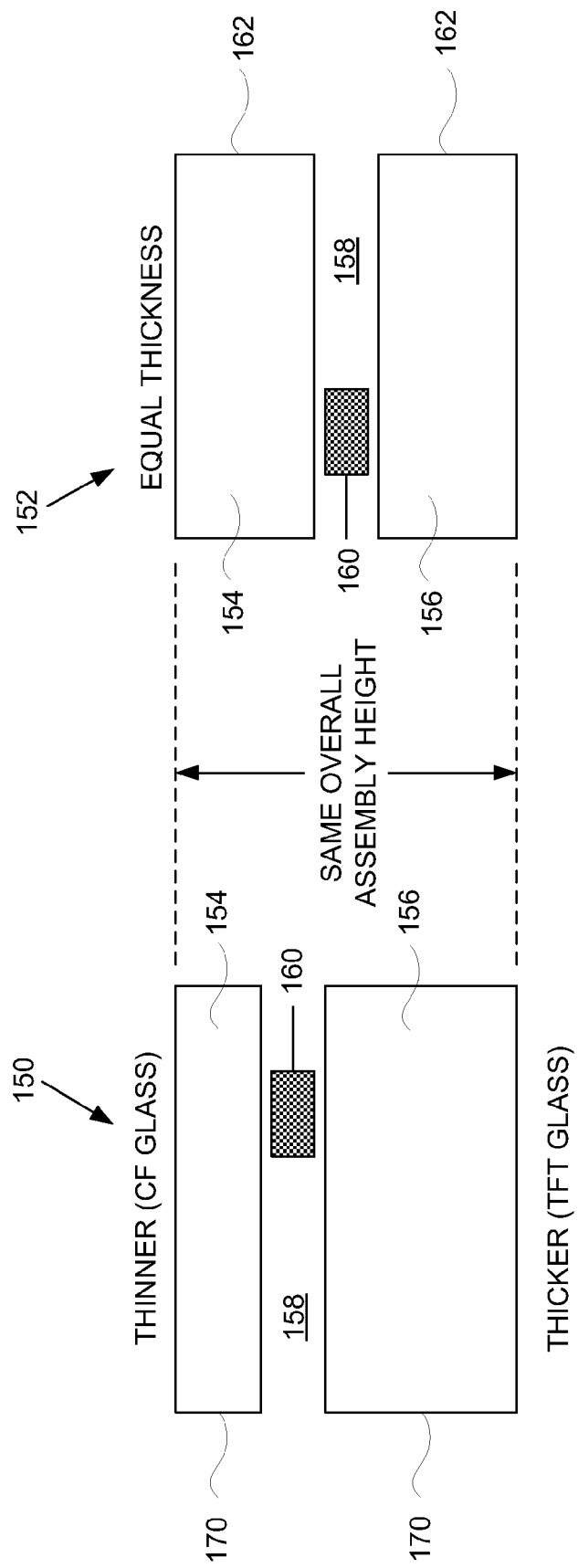
FIG. 3 is a side by side comparison of asymmetrical glass configuration and a symmetrical glass configuration, in accordance with one embodiment of the present invention.

FIG. 3 is a side by side comparison of asymmetrical glass configuration 150 and a symmetrical glass configuration 152, in accordance with one embodiment of the present invention. As shown, both include an upper glass sheet 154 and a lower glass sheet 156 that sandwich a liquid crystal layer 158 therebetween. The upper glass sheet 154 can be Color Filter (CF), and the lower glass sheet 156 can be Thin Film Transistor (TFT) glass. The liquid crystal layer 158 is also surrounded at the periphery of the LCMs via a gasket or seal 160. In the symmetrical glass configuration 152, the upper and lower glass sheets 154 and 156 have the same thickness. For example, the upper CF glass can have the same thickness as the lower TFT glass. In the asymmetrical glass configuration 150, the upper and lower glass sheets 154 and 156 have different thicknesses. For example, the upper CF glass is thinner and the lower TFT glass is thicker. Furthermore, in the symmetrical glass configuration 152, the cut edges 162 of both the upper and lower glass sheets 154 and 156 are formed from the same process, a process not configured to enhance strength but rather limit strength (not laser scribing). By way of example, both sheets are cut via a mechanical scribing process such as wheel scribing. Furthermore, in one embodiment the asymmetrical glass configuration 150, the cut edges 170 of both the upper and lower glass sheets 154 and 156 are formed from different processes, one of which is configured to enhance strength. By way of example, the thicker sheet may be cut via a laser scribing process while the thinner sheet may be cut via a mechanical scribing process (e.g., wheel scribe).

Figure 4:
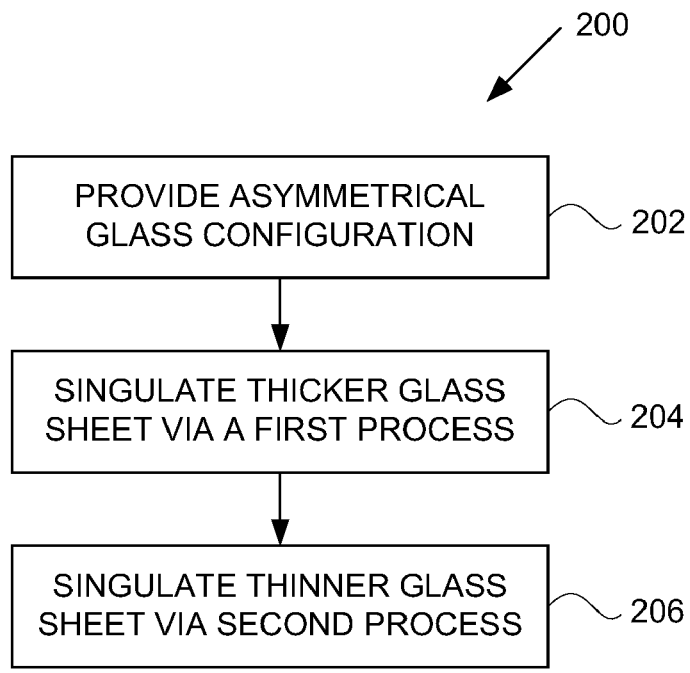
FIG. 4 is a method of producing a LCM, in accordance with one embodiment of the present invention.

FIG. 4 is a method 200 of producing an LCM, in accordance with one embodiment of the present invention. The method 200 may for example be used to create any of the LCMs disclosed herein. The method 200 may include block 202 where an asymmetrical glass configuration is provided for small form factor devices (e.g., thin). That is, an LCM that includes an upper and lower glass sheet of differing thicknesses is provided. In one embodiment, the upper sheet is thicker while the lower sheet is thinner. In another embodiment, the lower sheet is thicker while the upper sheet is thinner. In one particular embodiment, the upper glass carrying a CF layer is thinner while the lower glass carrying a TFT layer is thicker.

The combined thickness for the two sheets for LCMs used in small form factor devices may be widely varied. The current trend is that the combined thickness is ever shrinking in order to accommodate thinner and thinner devices or devices that need additional space for added functionality. By way of example, the combined thickness of the two sheets may be less than or equal to 0.8 mm, more particularly less than or equal to 0.6 mm, even more particularly less than or equal to 0.5 mm, even more particularly, less than or equal to 0.45 mm, and yet even more particularly less than or equal to 0.4 mm.

In one embodiment, the asymmetry is caused by equal but opposite changes in thickness to the glass sheets. For example, the thickness is increased by the same amount the thickness of the other glass sheet is decreased. The % change from the centerline thickness can be widely varied. It may be as great as 40% from the centerline value to as little as 1% of the centerline value. In some cases, it is between 33% and about 10%, while in other cases, it is between about 25% and about 20%. Furthermore, it may be more specifically between about 23% and about 22%, and more particularly around 22.2%. By way of example, if the centerline value is 0.225 then a 22.2% change would result in an asymmetrical glass configuration of about 0.275/0.175 or an increase of about 0.05 mm and a decrease of about 0.05 mm. It should be appreciated that these examples are given by way of example and not by way of limitation.

In another embodiment, the asymmetry is caused by different and opposite changes in the thickness of the glass sheets. For example, the thickness of one glass sheet may be increased more than a decrease of the other glass sheet (or vice versa). Furthermore, only one of the thicknesses may be altered in order to create the asymmetry. For example, one may remain unchanged while the other is increased or decreased. By way of example, one may be increased as much as 40% from centerline value while the other remains unchanged or changed a different percentage (%) from centerline value. In some examples, the thickness of each sheet can vary between about 33% and about 10%, while in other cases, it varies between about 25% and about 20%. Furthermore, it may be more specifically vary between about 23% and about 22%. For example, any ratio between 40-0%/40-0% of centerline value may be used so long as they are different. In some cases they are substantially different (greater than 5% difference, e.g., 20%/14%) while in other cases they are substantially close in the % changed (less than 5% difference, e.g., 20%/16%). Of coarse they may even be greater than 10% difference or less than 1% difference. The difference generally depends on the desired needs of the system.

The method 200 also may also include block 204 where the thicker glass sheet is singulated via a first process. The first process is configured to reduce microcracks and/or stress concentrations at the edges of the thicker sheet thereby increasing its overall strength.

The method 200 can also include block 206 where the thinner glass sheet is singulated via a second process that is different than the first process. Because the LCM strength is relying on the strength of the thicker sheet, the same attention given to the edge of the thicker sheet does not have to be made to the thinner sheet (i.e., the thicker sheet is providing most of the strength to the LCM). However, in an alternative embodiment, the edge of the thinner glass can also use the first process.

In most cases, the thickness of each sheet is configured for its particular process in order to obtain the desired cut with high yield rates. That is, the thickness is selected based on the capabilities of the process being used. In one embodiment, the thicker glass sheet is singulated using a laser scribe process, and the thinner glass sheet, which may be incapable of being laser scribed because of its thinness, is singulated with a process other than laser scribing. By way of example, conventional mechanical scribing techniques may be used to singulate the thinner glass sheet. For example, a mechanical cutting wheel may be used. In one embodiment, the thickness of the thicker sheet is greater than or equal to the minimum thickness required for the first process. As should be appreciated, the limit on how thin the glass can be for laser scribing can be based on the depth of the thermal gradient necessary for producing the required tensile stress in the glass. As the glass gets much thinner (e.g., less than 0.25-0.3 mm), the thermal gradient penetrates all the way through the backside of the glass and can disrupt its ability to create sufficient stress for crack propagation. Since there is a gap between the two sheets for the liquid crystal region, there would not be enough thermal conduction between them to change the minimum thickness limitation.

In one embodiment, the minimum thickness is a thickness greater than about 0.225. In another embodiment, the minimum thickness is a thickness greater than about 0.23. In another embodiment, the minimum thickness is a thickness greater than about 0.235. In another embodiment, the minimum thickness is a thickness greater than about 0.24. In another embodiment, the minimum thickness is a thickness greater than about 0.245. In another embodiment, the minimum thickness is a thickness greater than about 0.25. In another embodiment, the minimum thickness is a thickness greater than about 0.255. In another embodiment, the minimum thickness is a thickness greater than about 0.26. In another embodiment, the minimum thickness is a thickness greater than about 0.265. In another embodiment, the minimum thickness is a thickness greater than about 0.27. In another embodiment, the minimum thickness is a thickness greater than about 0.275. In another embodiment, the minimum thickness is a thickness greater than about 0.28. In another embodiment, the minimum thickness is a thickness greater than about 0.285. In another embodiment, the minimum thickness is a thickness greater than about 0.29. In another embodiment, the minimum thickness is a thickness greater than about 0.295. In another embodiment, the minimum thickness is a thickness greater than about 0.3.

Figure 5:
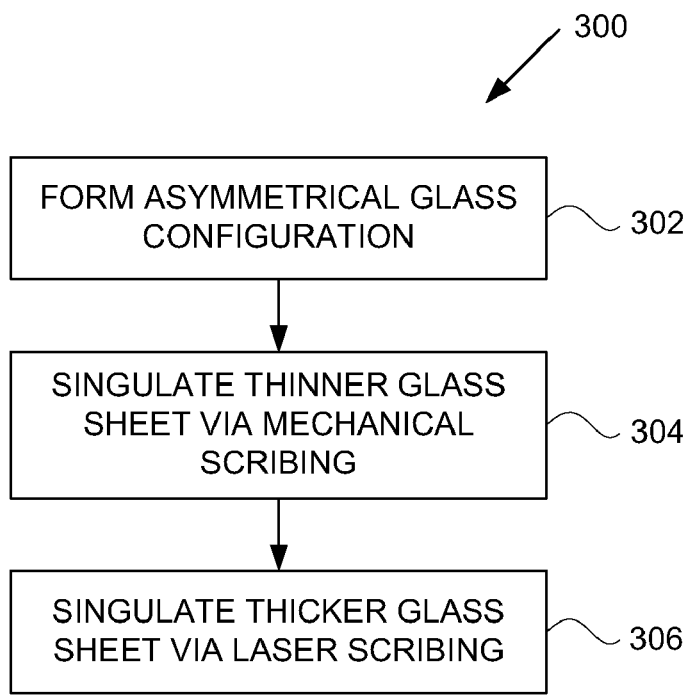
FIG. 5 is a method of producing a LCM, in accordance with another embodiment of the present invention.

FIG. 5 is a method 300 of producing an LCM, in accordance with one embodiment of the present invention. The method 300 may for example be used to create any of the LCMs disclosed herein. The method can include block 302 where an LCM stack having an asymmetrical glass thickness between upper and lower glass sheets is formed. The method can also include block 304 where the thinner glass sheet is cut via a mechanical scribing process such as mechanical wheel scribing. The method can also include block 306 where the thicker glass sheet is cut via laser scribing process. In laser scribing, the thickness of the thicker glass sheet is typically configured for laser scribing, i.e., it has the minimum thickness necessary to create the proper thermal gradient.

The cutting operations can be performed at different times or simultaneously. Further, the cutting operations may be performed in the same machine at the same location or different locations, or in entirely different machines.

Figure 6:
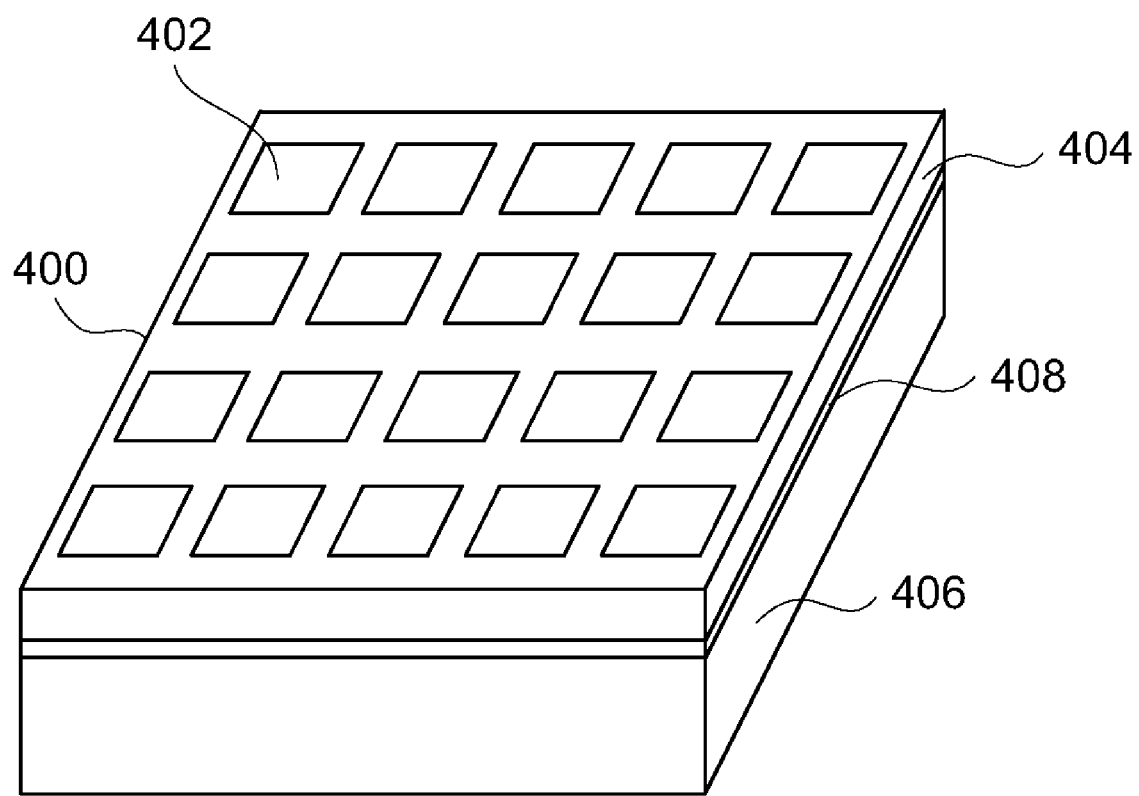
FIG. 6 is a diagram of a mother sheet containing a plurality of LCMs, in accordance with one embodiment of the present invention.

FIG. 6 is a diagram of a mother sheet 400 containing a plurality of LCMs 402, in accordance with one embodiment of the present invention. The mother sheet 400 includes upper and lower sheets 404 and 406 having an asymmetrical configuration. The sheets 404 and 406 are separated by a gasket 408 interposed between them. In most cases, the seal doesn't provide a lot of structural rigidity to the LCMs as it is formed from a relatively compliant material. The gasket 408 helps seal the liquid crystal material between the two glass sheets 404 and 406. The gasket 408 defines each of the LCMs 402 carried by the mother sheet 400. In one embodiment, during a singulation procedure to separate individual LCMs 402 from the mother sheet 400, the thicker glass sheet 406 is cut via a laser scribing process, and the thinner glass sheet 404 is cut via a mechanical scribing process. The scribing order may be widely varied. In some cases, the thinner side is singulated first, then the thicker side, and in other cases, the thicker side is first and then the thinner side. The separation may be accomplished in one or more cutting operations. In one embodiment, a first cutting process is used to scribe bars having a row of LCMs from the mother sheet, and a second cutting process is used to cut individual LCM cells from the bars. The first cutting operation may include for example scribing the thinner side, rotating the mother glass and then scribing the thicker side. The second cutting process may follow a similar sequence. Of course other cutting operations may be used.

Figure 7A:
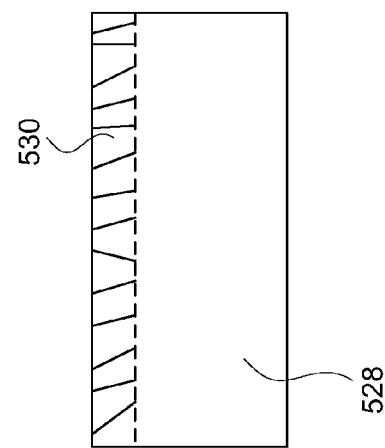
FIG. 7A is a diagram of a laser scribing process, in accordance with one embodiment of the present invention.
Figure 7B:
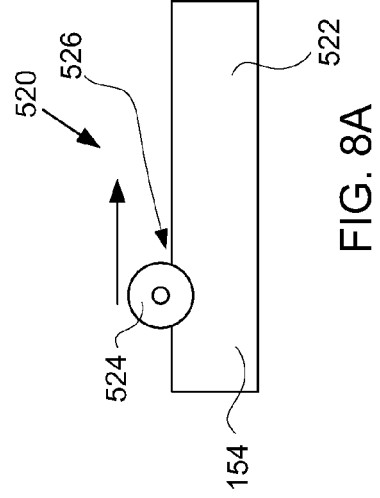
FIG. 7B is a side elevation view in cross section of a piece of glass after a laser scribing process, in accordance with one embodiment of the present invention.

FIG. 7A is a diagram of a laser scribing process 500, and FIG. 7B is a side elevation view in cross section of a piece of glass 502 after a laser scribing process. As shown in FIG. 7A, a laser 504 is made incident on the surface of the glass 502 and moved in a linear direction. Furthermore, a cooling beam 506 is applied to the surface of the glass 502 behind the laser 504. Both beams move across the glass surface in alignment one after the other, having started at an initial crack on the edge of the glass which is created via an alternate process such as a mechanical scribe process. Because the thermal gradient created by the rapid heating (laser) and cooling (cooling nozzle) merely generates enough tensile stress to overcome the glass material's internal strength and thusly propagate the initial crack, no material is removed in the process of laser scribing, but rather a shallow separation of the glass is achieved along the scribe line. The laser scribe line may for example be about 50-100 microns deep. Generally speaking, the laser rapidly heats the glass (substantially all of the energy is absorbed at the surface due to wavelength of laser, which is typically a CO2 type laser) and a mist of de-ionized water and air, or ethanol and nitrogen (cooling medium) subsequently rapidly cools it to create a thermal gradient about the line. The thermal gradient provides a stress that propagates the initial crack at the edge across the surface thereby scribing the sheet. As shown in FIG. 7B, after the beams have passed and after a break force has been applied to sever the glass 502 along the line, a clean surface 512 is created. The surface 512 is a generally free of micro-cracks and micro-chips, and includes very sharp upper and lower edges 514.

Figure 8A:
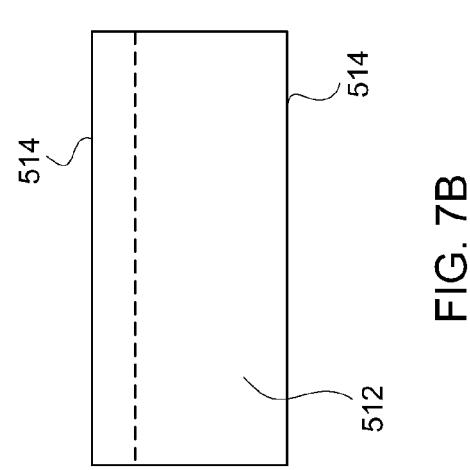
FIG. 8A is a diagram of a conventional wheel cutting process.
Figure 8B:
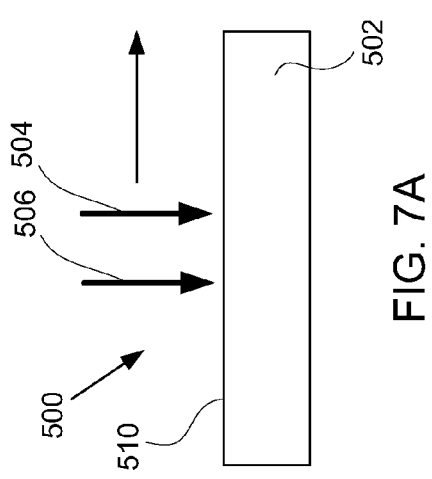
FIG. 8B is a side elevation view in cross section of a piece of glass after a wheel cutting process.

FIG. 8A is a diagram of a conventional wheel cutting process 520, and FIG. 8B is a side elevation view in cross section of a piece of glass 522 after a wheel cutting process. As shown in FIG. 8A. a rotating cutting wheel (e.g., blade) 524 is moved linearly across the surface of the glass 522 in order to create a cutting line 526. The wheel 524 typically does not cut completely through the glass 522 but rather scribes the surface of the glass 522 to some depth that can be as shallow as only a few tens of microns or as high as hundreds of microns, and sometimes all the way through the glass for sheets of small thickness. Depth of scribe depends on the configuration of the wheel, scribe pressure, and scribing rate. Optimal depth of scribe depends on glass thickness, composition, particular end-use application, and other factors. As the cutting wheel 524 encounters glass material, it abrasively attacks the glass thereby creating micro-cracks and micro-chips from a series of small explosions as the compressive stress of the material is overcome by the scribe pressure. As shown in FIG. 8B, after the wheel has passed and after a force has been applied to sever the glass along the line, a surface 528 with micro-cracks and micro-chips 530 is created. The micro-cracks and micro-chips 530 weaken the glass sheet 522 and make it more susceptible to breaking or developing larger cracks.

The various aspects, features, embodiments or implementations of the invention described above can be used alone or in various combinations.

While this specification contains many specifics, these should not be construed as limitations on the scope of the disclosure or of what may be claimed, but rather as descriptions of features specific to particular embodiment of the disclosure. Certain features that are described in the context of separate embodiments can also be implemented in combination. Conversely, various features that are described in the context of a single embodiment can also be implemented in multiple embodiments separately or in any suitable subcombination. Moreover, although features may be described above as acting in certain combinations, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results.

While this invention has been described in terms of several preferred embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method of forming a display with an asymmetric glass configuration, comprising:
    providing a first glass sheet having a first thickness;
    providing a second glass sheet having a second thickness;
    cutting the first glass sheet with a first cutting process, the first cutting process forming a first edge on the first glass sheet;
    cutting the second glass sheet with a second cutting process that is different than first cutting process, the second cutting process forming a second edge on the second glass sheet; and
    positioning the first and second sheets relative to one another in order to form the display.

2. The method as recited in claim 1, wherein the first cutting process is a laser scribe cutting process.

3. The method as recited in claim 2, wherein the first thickness is configured as the lowest possible thickness capable of being laser scribed, and
    wherein the second thickness is configured less than the lowest possible thickness capable of being laser scribed.

4. The method as recited in claim 2, wherein the second cutting process is a wheel scribing cutting process.

5. The method as recited in claim 1, wherein said providing the first and second glass sheets comprise:
    selecting a combined thickness of the first thickness and the second thickness; and
    forming the first glass sheet and the second glass sheet utilizing the combined thickness, said forming including increasing the first thickness for the first glass sheet while decreasing the second thickness for the second glass sheet.

6. The method as recited in claim 5, wherein the increase is proportional to the decrease.

7. The method as recited in claim 1, wherein the second thickness is not capable of being cut by the first cutting process.

8. The method as recited in claim 1, wherein the display is a liquid crystal display (LCD).

9. The method as recited in claim 1, wherein the first glass sheet and the second glass sheet are components of a liquid crystal module (LCM).

10. The method as recited in claim 1, wherein said method further comprises:
provriding high density spacer elements between the first glass sheet and the second glass sheet.

11. The method as recited in claim 10, wherein the high density spacer elements are provided every 6-10 pixels of the display.

12. The method as recited in claim 1,
wherein the first edge has a first edge character,
wherein the second edge has a second edge character, and
wherein the first edge character is a fine cut edge and the second edge character is a coarse cut edge.

13. The method as recited in claim 12, wherein the first edge character has less stress concentrations than the second edge character.

14. The method as recited in claim 12, wherein the first edge character is sharper than the second edge character.

15. The method as recited in claim 1, wherein the first and second glass sheets are formed from borosilicate or sodalime.

16. The method as recited in claim 1, wherein the combined thickness of the first and second thickness is less than 0.6 mm.

17. The method as recited in claim 1, wherein the combined thickness of the first and second thickness is about 0.4 mm.

18. The method as recited in claim 17, wherein the first thickness is about 0.25 mm and the second thickness is about 0.15 mm.

19. The method as recited in claim 1, wherein the first and second thickness are combined to form a combined thickness, and
wherein the first thickness is larger than half of the combined thickness, and the second thickness is smaller than half of the combined thickness.

20. The method as recited in claim 19, wherein the increase in the first thickness as compared to the thickness of half of the combined thickness is same as the decrease in the second thickness as compared to the thickness of half of the combined thickness.

21. The method as recited in claim 19, wherein the percentage change of the increase or decrease as compared to a centerline value corresponding to half the combined thickness is between about 40% and about 1%.

22. The method as recited in claim 19, wherein the percentage change of the increase or decrease as compared to a centerline value corresponding to half the combined thickness is between about 20-30%.

* * * * *